(12) United States Patent
Ohshima

(10) Patent No.: US 9,356,015 B2
(45) Date of Patent: May 31, 2016

(54) COMPOSITE SEMICONDUCTOR DEVICE

(71) Applicant: SHARP KABUSHIKI KAISHA, Osaka-shi, Osaka (JP)

(72) Inventor: Yoshifumi Ohshima, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 14/418,862

(22) PCT Filed: Jul. 29, 2013

(86) PCT No.: PCT/JP2013/070437
§ 371 (c)(1),
(2) Date: Jan. 30, 2015

(87) PCT Pub. No.: WO2014/034346
PCT Pub. Date: Mar. 6, 2014

(65) Prior Publication Data
US 2015/0214216 A1 Jul. 30, 2015

(30) Foreign Application Priority Data

Aug. 28, 2012 (JP) .................................. 2012-187767

(51) Int. Cl.
H01L 27/11 (2006.01)
H01L 29/15 (2006.01)
(Continued)

(52) U.S. Cl.
CPC ............ *H01L 27/0629* (2013.01); *H01L 28/20* (2013.01); *H03K 17/102* (2013.01); *H01L 27/0883* (2013.01); *H03K 2017/6875* (2013.01)

(58) Field of Classification Search
CPC ............ H01L 27/0605; H01L 29/2003; H01L 29/66462; H01L 29/7786; H01L 27/0883; H01L 27/0629; H01L 28/10; H03K 17/102; H03K 2017/6875

USPC ............ 257/379, 76, 288, E27.061, 133, 134, 257/205; 438/587
See application file for complete search history.

(56) References Cited

U.S. PATENT DOCUMENTS 7,939,857 B1* 5/2011 Wyatt ............................ 257/205
8,487,667 B2 7/2013 Iwamura
(Continued)

FOREIGN PATENT DOCUMENTS

JP 2002-76020 A 3/2002
JP 2006-324839 A 11/2006
(Continued)

OTHER PUBLICATIONS

Tsuyoshi Funaki et al. "Measuring Terminal Capacitance and Its Voltage Dependency for High-Voltage Power Devices", IEEE Transactions on Power Electronics, vol. 24, No. 6, pp. 1486-1493, (Jun. 2009).*

(Continued)

*Primary Examiner* — Long K Tran
*Assistant Examiner* — Dzung Tran
(74) *Attorney, Agent, or Firm* — Birch, Stewart, Kolasch & Birch, LLP

(57) ABSTRACT

In a composite semiconductor device which is provided with a normally-on-type first transistor and a normally-off-type second transistor which are serially connected, the second transistor is selected so as to satisfy Formula (1):

$$C_{oss} > \frac{C_{ds}V_{ds}}{V_{br}} - C_{ds} - C_{gs} \qquad (1)$$

In this regard: Coss: output capacitance of second transistor Cds: drain to source capacitance of first transistor Cgs: gate to source capacitance of first transistor Vds: power supply voltage Vbr: breakdown voltage of second transistor.

5 Claims, 5 Drawing Sheets

(51) Int. Cl.
*H01L 29/66* (2006.01)
*H01L 29/76* (2006.01)
*H01L 27/06* (2006.01)
*H03K 17/10* (2006.01)
*H01L 49/02* (2006.01)
*H01L 27/088* (2006.01)
*H03K 17/687* (2006.01)

(56) References Cited

U.S. PATENT DOCUMENTS

| | | | |
|---|---|---|---|
| 8,766,275 B2 | 7/2014 | Iketani et al. | |
| 2006/0113593 A1* | 6/2006 | Sankin et al. | 257/341 |
| 2007/0215899 A1* | 9/2007 | Herman | 257/147 |
| 2008/0230784 A1 | 9/2008 | Murphy | |
| 2011/0199148 A1 | 8/2011 | Iwamura | |
| 2012/0199875 A1* | 8/2012 | Bhalla et al. | 257/134 |
| 2012/0262220 A1* | 10/2012 | Springett | 327/430 |
| 2012/0280271 A1* | 11/2012 | Ichikawa | 257/133 |
| 2012/0292635 A1 | 11/2012 | Iketani et al. | |

FOREIGN PATENT DOCUMENTS

| | | |
|---|---|---|
| JP | 2010-522432 A | 7/2010 |
| JP | 2011-166673 A | 8/2011 |
| WO | WO 2011/089837 A1 | 7/2011 |

OTHER PUBLICATIONS

International Search Report issued in PCT/JP2013/070437, mailed on Sep. 10, 2013.
Siemieniec et al., "Stability and performance analysis of a SiC-based cascode switch and an alternative solution," Journal of Microelectronics Reliability, 2012, vol. 52, pp. 509-518.
Brown, et al., "Power MOSFET Basics: Understanding MOSFET Characteristics Associated With the Figure of Merit," Vishay Siliconix, Document No. 71933, Sep. 8, 2003, pp. 1-4.

* cited by examiner

COMPOSITE SEMICONDUCTOR DEVICE

TECHNICAL FIELD

The present invention relates to a composite semiconductor device, more particularly, to a composite semiconductor device that includes a transistor of normally on type and a transistor of normally off type which are connected in series with each other.

BACKGROUND ART

Si(silicon)-based field effect transistors mainly used in semiconductor devices of today are of normally off type. A field effect transistor of normally off type is a transistor that is turned on in a case where a positive voltage is applied between a gate and a source, and turned off in a case where the positive voltage is not applied between the gate and the source.

Besides, GaN (gallium nitride) based and SiC (silicon carbide)-based field effect transistors, whose practical use is under study because of features such as high breakdown voltage, low loss, high-speed switching, high-temperature operation and the like, are of normally on type. A transistor of normally on type has a negative threshold voltage, is turned off in a case where a gate-source voltage is lower than the threshold voltage, and turned on in a case where the gate-source voltage is higher than the threshold voltage.

If such a field effect transistor of normally on type is used in a semiconductor device, various problems such as that a conventional gate drive circuit cannot be used and the like occur. Accordingly, it is proposed to compose a composite semiconductor device of normally off type by connecting a first field effect transistor of normally on type and a second field effect transistor of normally off type in series with each other.

For example, in a patent document 1, such a composite semiconductor device is disclosed, in which a drain-source voltage of the second field effect transistor of normally off type becomes higher than a breakdown voltage; and to prevent the second field effect transistor from falling into an avalanche state to be broken, a Zener diode is connected between the drain and the source of the second field effect transistor to limit the drain-source voltage to a voltage equal to or lower than the breakdown voltage.

CITATION LIST

Patent Literature

PLT1: JP-A-2006-324839

Non-Patent Literature

Non-PLT1: [Stability and performance analysis of a SiC-based cascode switch and an alternative solution], Ralf Siemieniec, Microelectronics Reliability, Volume 52, Issue 3, March 2012, Pages 509-518.]

SUMMARY OF INVENTION

Technical Problem

However, in the above patent document 1, during a turned-off state of the first field effect transistor, electric charges of the second field effect transistor leak; accordingly, there is a problem that the control becomes unstable (see the non-patent document 1).

Accordingly, it is an object of the present invention to provide a composite semiconductor device that is able to curb the breakdown and unstable control of a transistor of normally off type.

Solution to Problem

To achieve the above object, a composite semiconductor device according to an aspect of the present invention comprises a first transistor of normally on type and a second transistor of normally off type that are connected in series with each other, wherein the second transistor meeting a formula (1) is selected:

$$C_{oss} > \frac{C_{ds} V_{ds}}{V_{br}} - C_{ds} - C_{gs} \qquad (1)$$

where Coss: output capacitance of the second transistor, Cds: capacitance between a drain and source of the first transistor, Cgs: capacitance between a gate and the source of the first transistor, Vds: power-source voltage, Vbr: breakdown voltage of the second transistor.

Besides, a composite semiconductor device according to another aspect of the present invention comprises a first transistor of normally on type and a second transistor of normally off type that are connected in series with each other, wherein the first transistor meeting a formula (2) is selected:

$$C_{ds} < (C_{oss} + C_{gs}) \frac{V_{br}}{V_{ds} - V_{br}} \qquad (2)$$

where Coss: output capacitance of the second transistor, Cds: capacitance between a drain and source of the first transistor, Cgs: capacitance between a gate and the source of the first transistor, Vds: power-source voltage, Vbr: breakdown voltage of the second transistor.

Besides, a composite semiconductor device according to another aspect of the present invention comprises a first transistor of normally on type and a second transistor of normally off type, wherein a ratio between a power source voltage Vds and a breakdown voltage Vbr of the second transistor is 10 or higher, and the second transistor meeting a formula (3) is selected:

$$C_{oss} > \frac{V_{ds}}{V_{br}} C_{ds} \qquad (3)$$

where Coss: output capacitance of the second transistor, Cds: capacitance between a drain and source of the first transistor.

Besides, a composite semiconductor device according to another aspect of the present invention comprises a first transistor of normally on type and a second transistor of normally off type that are connected in series with each other, wherein a ratio between a power source voltage Vds and a breakdown voltage Vbr of the second transistor is 10 or higher, and the first transistor meeting a formula (4) is selected:

$$C_{ds} < \frac{V_{br}}{V_{ds}} C_{oss} \qquad (4)$$

where Coss: output capacitance of the second transistor, Cds: capacitance between a drain and source of the first transistor.

Besides, a composite semiconductor device according to another aspect of the present invention comprises a first transistor of normally on type and a second transistor of normally off type that are connected in series with each other, wherein the first transistor and the second transistor that meet a formula (5) are selected:

$$V_{br} > V_{m1} + \frac{C_{ds}V_{ds}}{C_{oss} + C_{ds} + C_{gs}} \qquad (5)$$

where Coss: output capacitance of the second transistor, Cds: capacitance between a drain and source of the first transistor, Cgs: capacitance between a gate and the source of the first transistor, Vds: power-source voltage, Vm1: drain voltage of the second transistor at a time when the first transistor is turned off after the second transistor is turned off, Vbr: breakdown voltage of the second transistor.

Advantageous Effects of Invention

According to the composite semiconductor device of the present invention, without using an additional device that causes unstable control, it is possible to keep the drain voltage of the second transistor of normally off type lower than the breakdown voltage during a turned-off period and to curb breakdown of the second transistor.

DESCRIPTION OF EMBODIMENTS

Figure 1:
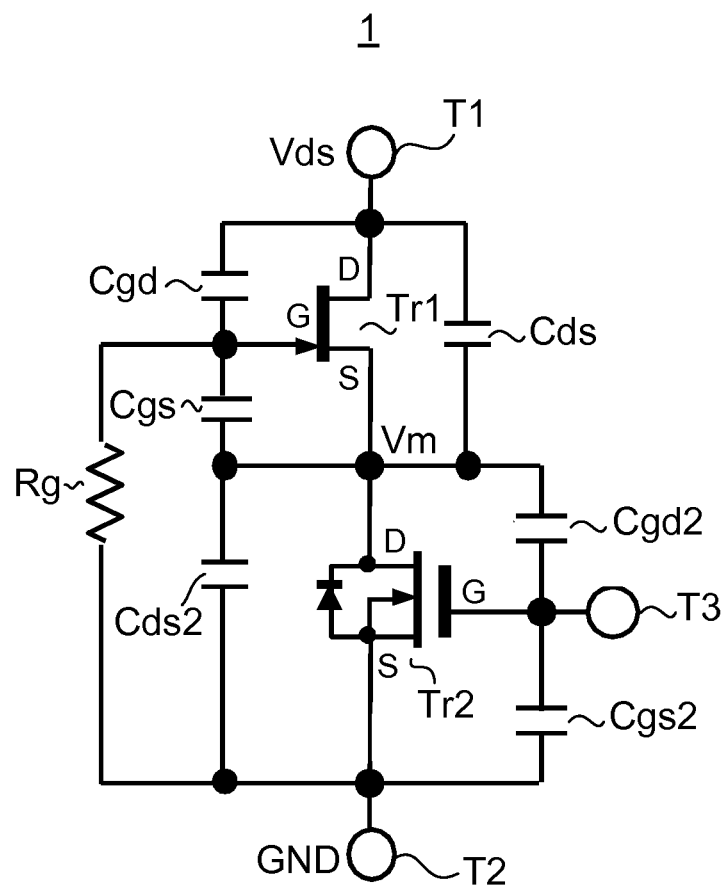
FIG. 1 is a structural view of a composite semiconductor device according to an embodiment of the present invention.

Hereinafter, an embodiment of the present invention is described with reference to the drawings. FIG. 1 shows a structure of a composite semiconductor device according to the embodiment of the present invention.

The composite semiconductor device 1 shown in FIG. 1 includes: a high-breakdown voltage first field effect transistor of normally on type (hereinafter, called a FET) Tr1; a low-breakdown voltage second FET Tr2 of normally off type; a gate-drain capacitance Cgd of the first FET Tr1; a gate-source capacitance Cgs of the first FET Tr1; a drain-source capacitance Cds of the first FET Tr1; a gate-drain capacitance Cgd2 of the second FET Tr2; a gate-source capacitance Cgs2 of the second FET Tr2; a drain-source capacitance Cds2 of the second FET Tr2; a gate resistance Rg; a power source terminal T1; a ground terminal T2; and a gate terminal T3.

The first FET Tr1 and the second FET Tr2 are connected in series with each other. The drain of the first FET Tr1 is connected to the power source terminal T1 to which a power source voltage Vds is applied. And, the source of the second FET Tr2 is connected to the ground terminal T2 to which a ground potential is connected.

The gate of the second FET Tr2 is connected to the gate terminal T3. Besides, the gate resistance Rg is inserted between the gate of the first FET Tr1 and a connection point between the source of the second FET Tr2 and the ground terminal T2. In the meantime, without disposing the gate resistance Rg, the gate of the first FET Tr1 and the connection point between the source of the second FET Tr2 and the ground terminal T2 may be short-circuited to each other.

Next, in the composite semiconductor device 1 having such a structure, behavior of a drain voltage Vm of the second FET Tr2 is described in a case where the second FET Tr2 is turned off when the first FET Tr1 and the second FET Tr2 are in an on-state.

If a gate-source voltage of the second FET Tr2 is switched from an on-voltage to an off-voltage when the first FET Tr1 and the second FET Tr2 are in the on-state, a drain-source voltage of the second FET Tr2 occurs, a source voltage of the first FET Tr1 increases, and the drain voltage Vm of the second FET Tr2 increases until the gate-source voltage of the first FET Tr1 reaches a negative threshold voltage Vth. When the drain voltage Vm of the second FET Tr2 is Vm1 at a time the gate-source voltage of the first FET Tr1 reaches the threshold voltage Vth, Vm1 is represented by a formula (1).

$$V_{m1} = R_g(C_{gd} + C_{gs})k(1 - e^{-1/R_g(C_{gs}+C_{gd})}) - V_{th} \qquad (1)$$

where Rg: resistance value of the gate resistance Rg, Cgd: capacitance value of the capacitance Cgd between the gate and drain of the first FET Tr1, Cgs: capacitance value of the capacitance Cgs between the gate and source of the first FET Tr1, k: a constant showing a degree of the increase in the drain voltage of the second FET Tr2, t: time.

The time t in the above formula (1) meets a formula (2).

$$V_{gs} = R_g C_{iss} k(1 - e^{-1/R_g C_{iss}}) - kt - V_{th} = 0 \qquad (2)$$

where Ciss=Cgd+Cgd and is an input capacitance of the first FET Tr1.

The first FET Tr1 is turned off at a time when the drain voltage Vm of the second FET Tr2 reaches Vm1, and a drain-source voltage of the first FET Tr1 occurs. In the meantime, as is clear from the formula (1), in a case where the gate resistance Rg of the first FET Tr1 is not disposed, Rg=0 and Vm1=−Vth.

Next, the increase in the drain voltage Vm of the second FET Tr2 after the first FET Tr1 is turned off is described. The first FET Tr1 is turned off and a voltage occurs between the drain and source of the first FET Tr1. At this time, the drain voltage Vm of the second FET Tr2 increases in accordance with a formula (3).

$$V_m = \frac{C_{ds} k_2}{C_{oss} + C_{ds} + C_{gs}} t \qquad (3)$$

where Cds: capacitance value of capacitance Cds between a drain and source of the first FET Tr1, Coss: output capacitance of the second FET Tr2 (total capacitance value of capacitance Cds2 between a drain and source of the second FET Tr2 and capacitance Cgd2 between a gate and drain of the second FET Tr2), $k_2$: a constant showing a degree of increase in drain voltage of the first FET Tr1.

Vm increases in accordance with the formula (3) until the drain voltage of the first FET Tr1 reaches the power source voltage Vds; accordingly, the increase stops at a time when $k_2 \times t = Vds$. Finally, the increase in Vm stops at a time when Vm reaches Vm2 represented by a formula (4).

$$V_{m2} = \frac{C_{ds} V_{ds}}{C_{oss} + C_{ds} + C_{gs}} \qquad (4)$$

Here, as described above, at the time when the drain voltage Vm of the second FET Tr2 reaches Vm1, electric charges stored in the drain-source capacitance of the second FET TR2 remain as an offset; accordingly, the final value of Vm is represented by a sum of Vm1 and Vm2.

Here, to prevent the second FET Tr2 from breaking down during a turned-off state of the composite semiconductor device 1, when a breakdown voltage of the second FET Tr2 is Vbr, the drain-source capacitance Cds and gate-source capacitance Cgs of the first FET Tr1, and the output capacitance Coss of the second FET Tr2 are set to meet a formula (5), where Vm1 is negligible.

$$V_{br} > \frac{C_{ds} V_{ds}}{C_{oss} + C_{ds} + C_{gs}} \qquad (5)$$

Here, the formula (5) can be rewritten to a formula (6).

$$C_{oss} > \frac{C_{ds} V_{ds}}{V_{br}} - C_{ds} - C_{gs} \qquad (6)$$

Accordingly, if the second FET Tr2, which has the output capacitance Coss meeting the formula (6), is selected, it is possible to alleviate the second FET Tr2 breaking down during the turned-off state. At this time, respective capacitance values of the drain-source capacitance Cds and gate-source capacitance Cgs of the first FET Tr1 in the formula (6) are actually measured, and are measurable by means of a method described in the following document 1, for example. Besides, also respective capacitance values of the drain-source capacitance Cds2 and gate-drain capacitance Cgd2 of the second FET Tr2 to obtain Coss in the formula (6) are measurable by means of the method described in the following document 1.

<Document 1>

Funaki, T.; Phankong, N.; Kimoto, T.; Hikihara, T.; "Measuring Terminal Capacitance and Its Voltage Dependency for High-Voltage Power Devices," Power Electronics, IEEE Transactions on, vol. 24, no. 6, pp. 1486-1493, June 2009 doi: 10.1109/TPEL. 2009.2016566.

Besides, the formula (5) can also be rewritten to a formula (7).

$$C_{ds} < (C_{oss} + C_{gs}) \frac{V_{br}}{V_{ds} - V_{br}} \qquad (7)$$

Accordingly, if the first FET Tr1, which has the drain-source capacitance Cds meeting the formula (7), is selected, it is possible to alleviate the second FET Tr2 breaking down during the turned-off state. At this time, each capacitance value in the formula (7) are measurable by means of the method described in the above document 1, for example.

In the meantime, in a case where a ratio between the power source voltage Vds and the breakdown voltage Vbr is 10 or higher, the terms other than the first term in the right side of the formula (6) are negligible; accordingly, the formula (6) becomes a formula (8). Accordingly, in this case, if the second FET Tr2, which has the output capacitance Coss meeting the formula (8), is selected, it is possible to alleviate the second FET Tr2 breaking down during the turned-off state.

$$C_{oss} > \frac{V_{ds}}{V_{br}} C_{ds} \qquad (8)$$

Further, the formula (8) can be rewritten to a formula (9). Accordingly, if the first FET Tr1, which has the drain-source capacitance Cds meeting the formula (9), is selected, it is possible to alleviate the second FET Tr2 breaking down during the turned-off state.

$$C_{ds} < \frac{V_{br}}{V_{ds}} C_{oss} \qquad (9)$$

Besides, as described above, the final Vm is represented by the sum of Vm1 and Vm2; accordingly, a formula (10) is obtained.

$$V_m = V_{m1} + \frac{C_{ds} V_{ds}}{C_{oss} + C_{ds} + C_{gs}} \qquad (10)$$

Accordingly, in a case where Vm1 is not negligible or Vm1 is strictly considered, to alleviate the second FET Tr2 breaking down during the turned-off state, when the breakdown voltage of the second FET Tr2 is Vbr, the drain-source capacitance and gate-source capacitance of the first FET Tr1, and the output capacitance of the second FET Tr2 are set to meet a formula (11) (i.e., the first FET Tr1 and second FET Tr2 that have such capacitances are selected).

$$V_{br} > V_{m1} + \frac{C_{ds} V_{ds}}{C_{oss} + C_{ds} + C_{gs}} \qquad (11)$$

Further, in a case where the gate resistance Rg=0, the formula (11) can be rewritten to a formula (12) by means of the formula (1); accordingly, the first FET Tr1 and the second FET Tr2, which meet the formula (12), are selected.

$$V_{br} > -Vth + \frac{C_{ds}V_{ds}}{C_{oss} + C_{ds} + C_{gs}} \quad (12)$$

As described above, by suitably selecting the second FET Tr2 and/or the first FET Tr1, it is possible to alleviate the breakdown of the second FET Tr2 without using an additional device that causes unstable control.

Here, if the output capacitance Coss of the second FET TR2 is enlarged, it is clear that conditions meeting the formula (5) or the formula (11) are easy, but it is concerned about increase in switching loss due to capacitance increase. However, by employing a cascode structure of the present embodiment, as to a voltage applied between the drain and source of the first FET Tr1, the minimum voltage is (the power source voltage—the breakdown voltage of the second FET Tr2), and the maximum voltage is (the power source voltage—the threshold voltage of the first FET Tr1); accordingly, a high voltage having a great influence on the switching loss is applied to the first FET Tr1. Therefore, the second FET Tr2 has almost no influence on the switching loss. In this way, it becomes possible to raise the reliability of the cascode device without deteriorating the switching loss.

Figure 2:
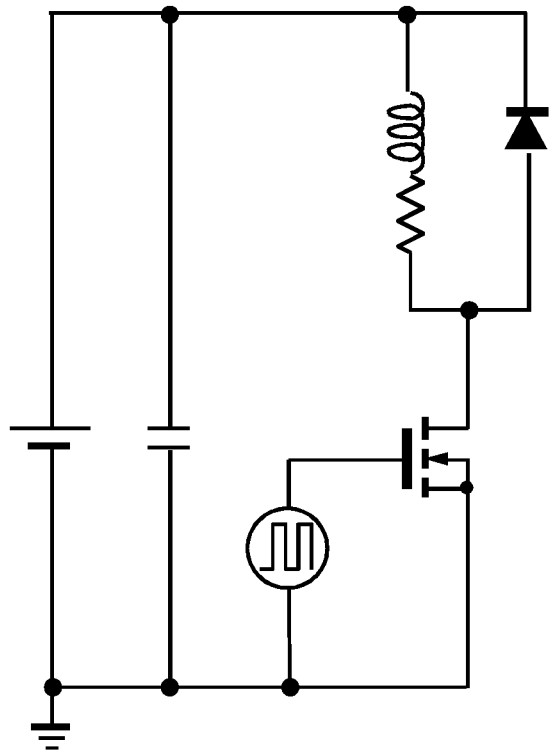
FIG. 2 is a view showing an L load circuit for simulation according to an embodiment of the present invention.

Next, verification of the present embodiment is performed by means of a simulation. The simulation is performed by means of an L load circuit shown in FIG. 2. The respective capacitances of the first FET Tr1 and second FET Tr2 are shown in a pattern 1 of a table 1. The power source voltage is set at 600 V, the threshold voltage of the first FET Tr1 is set at −6.5 V. Besides, the breakdown voltage of the second FET Tr2 is set at 20 V.

TABLE 1

|  | pattern1 | pattern2 |
| --- | --- | --- |
| Coss (pF) | 950 | 950 |
| Cds (pF) | 50 | 25 |
| Cgs (pF) | 150 | 150 |

Figure 3:
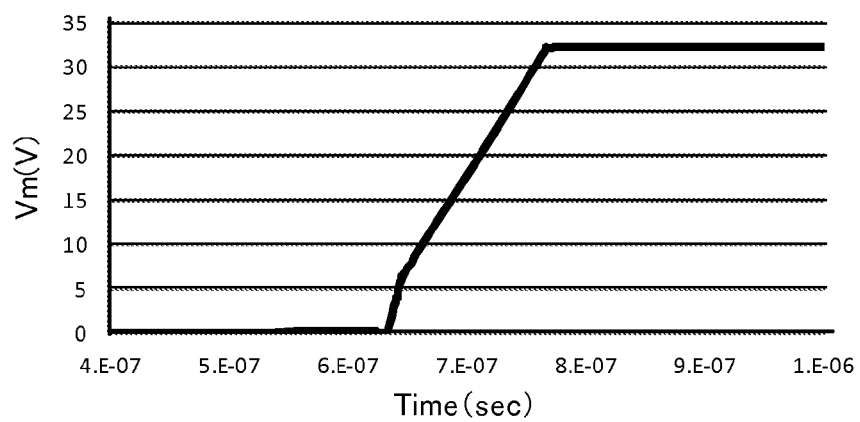
FIG. 3 is a graph showing an analyzed waveform of a drain voltage as a simulation result of a second FET according to an embodiment of the present invention.

An analyzed waveform of the drain voltage Vm of the second FET Tr2 is shown in FIG. 3 as a simulation result. Vm finally becomes 33 V and dramatically exceeds the breakdown voltage 20 V. Performing calculation by means of the formula (10), when Vm1 is set at 6.6 V, Vm=Vm1+Vm2=6.6 V+50 pF/(950 pF+50 pF+150 pF)×600 V=33 V.

Figure 4:
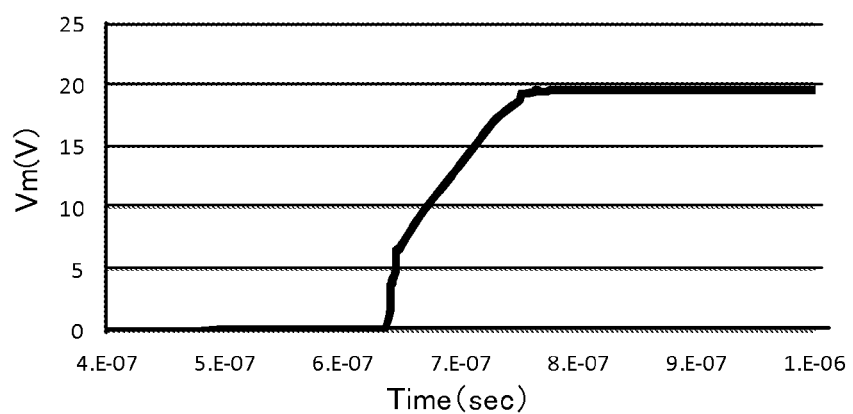
FIG. 4 is a graph showing an analyzed waveform of a drain voltage as a simulation result of a second FET according to an embodiment of the present invention.

Accordingly, if Cds is adjusted to meet the formula (11), 20 V>6.6 V+Cds/(950 pF+Cds+150 pF)×600 V, and Cds<25.13 pF. To confirm the effect, a simulation is performed, in which Cds=set at 25 pF in a pattern 2 shown in the table 1. An analyzed waveform of Vm is shown in FIG. 4 as a result of this. From the analysis result, it is understood that Vm finally becomes 19.5 V which is smaller than the breakdown voltage 20 V and a purpose is achieved.

Besides, to verify effectiveness of the present embodiment by means of actual measurement, actual measurement values of Vm are evaluated by means of two kinds of composite semiconductor devices A, B in which only the drain-source capacitance of the first FET is changed. Each capacitance of the composite semiconductor devices is measured by means of the method of the above document 1. A table 2 shows the drain-source capacitances Cds of the first FET of the composite semiconductor devices A, B.

TABLE 2

| Vds (V) | Cds_A (pF) | Cds_B (pF) |
| --- | --- | --- |
| 100 | 30 | 37 |
| 200 | 23 | 31 |
| 300 | 22 | 29 |

As shown in the table 2, even in the same devices, the drain-source capacitance Cds changes in accordance with the power source voltage Vds. This is because depletion of a channel advances and the capacitance becomes small when the power source voltage Vds becomes large. Besides, the gate-source capacitance Cgs of the first FET is set at 160 pF. Also Cgs changes depending on the power source voltage, but the change is very small in the devices used this time; accordingly, it is set at a constant value.

Figure 5:
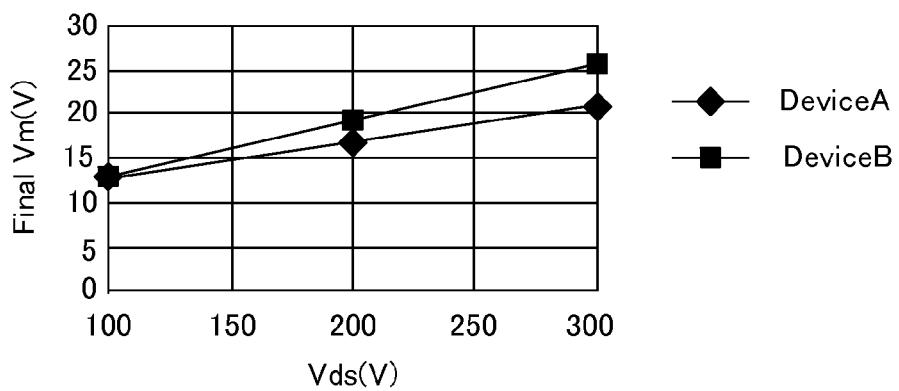
FIG. 5 is a graph showing a relationship between a power source voltage and a final actual measurement value of a drain voltage of a second FET according to an embodiment of the present invention.
Figure 6:
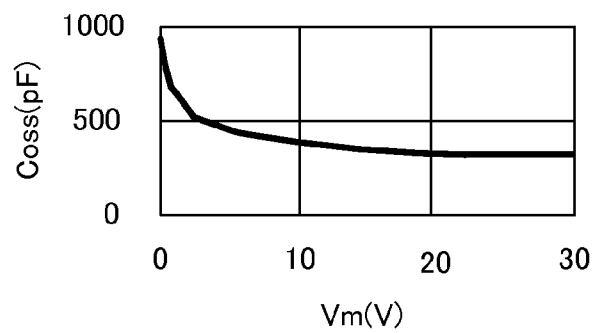
FIG. 6 is a graph showing a relationship between a drain voltage of a second FET according to an embodiment of the present invention and an actual measurement value of an output capacitance of the second FET.

Besides, the output capacitance Coss of the second FET is as follows. FIG. 5 shows relationships between the power source voltage Vds and the final actual measurement values of Vm in the composite semiconductor devices A, B. For example, at the power source voltage Vds=100 V, Vm becomes nearly 13 V, at Vds=300 V, Vm becomes nearly 25 V. Besides, FIG. 6 shows Coss that is measured with Vm being changed. In FIG. 6, at Vm=nearly 15 V, Coss becomes 330 pF, and at Vm=nearly 25 V, Coss becomes 290 pF. Accordingly, as to Coss, a value, which corresponds to the final value of Vm in accordance with the power source voltage Vds, is used.

Figure 7:
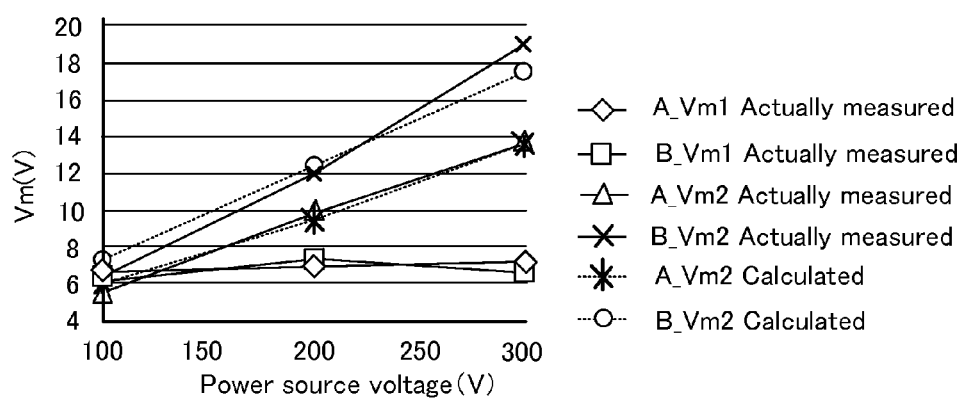
FIG. 7 is a graph showing an actual measurement value of a drain voltage and a calculated value of the drain voltage of a second FET according to an embodiment of the present invention.

Besides, the threshold voltage is set at −7 V. FIG. 7 shows a comparison result between the actual measurement value Vm2 and the value Vm2 calculated by means of the formula (4). It is understood that the actual measurement result and the value calculated by means of the formula (4) match each other with a high accuracy.

Hereinbefore, the embodiment of the present invention is described. However, the embodiment can be variously modified within the spirit of the present invention.

REFERENCE SIGNS LIST

1 composite semiconductor device
Tr1 first field effect transistor
Tr2 second field effect transistor
Rg gate resistance
Vds power source voltage
T1 power source terminal
T2 ground terminal
T3 gate terminal

The invention claimed is:
1. A composite semiconductor device comprising a first transistor of normally on type and a second transistor of normally off type that are connected in series with each other, wherein
a source of the first transistor is connected to a drain of the second transistor,
a gate of the first transistor is connected to a source of the second transistor via a resistor, and
the second transistor meeting a formula (1) is selected:

$$C_{oss} > \frac{C_{ds}V_{ds}}{V_{br}} - C_{ds} - C_{gs} \quad (1)$$

where Coss: output capacitance of the second transistor, Cds: capacitance between a drain and source of the first transistor, Cgs: capacitance between a gate and the source of the first transistor, Vds: power-source voltage, Vbr: breakdown voltage of the second transistor.

2. A composite semiconductor device comprising a first transistor of normally on type and a second transistor of normally off type that are connected in series with each other, wherein
a source of the first transistor is connected to a drain of the second transistor,
a gate of the first transistor is connected to a source of the second transistor via a resistor, and
the first transistor meeting a formula (2) is selected:

$$C_{ds} < (C_{oss} + C_{gs})\frac{V_{br}}{V_{ds} - V_{br}} \quad (2)$$

where Coss: output capacitance of the second transistor, Cds: capacitance between a drain and source of the first transistor, Cgs: capacitance between a gate and the source of the first transistor, Vds: power-source voltage, Vbr: breakdown voltage of the second transistor.

3. A composite semiconductor device comprising a first transistor of normally on type and a second transistor of normally off type that are connected in series with each other, wherein
a source of the first transistor is connected to a drain of the second transistor,
a gate of the first transistor is connected to a source of the second transistor via a resistor, and
a ratio between a power source voltage Vds and a breakdown voltage Vbr of the second transistor is 10 or higher, and the second transistor meeting a formula (3) is selected:

$$C_{oss} > \frac{V_{ds}}{V_{br}} C_{ds} \quad (3)$$

where Coss: output capacitance of the second transistor, Cds: capacitance between a drain and source of the first transistor.

4. A composite semiconductor device comprising a first transistor of normally on type and a second transistor of normally off type that are connected in series with each other, wherein
a source of the first transistor is connected to a drain of the second transistor,
a gate of the first transistor is connected to a source of the second transistor via a resistor, and
a ratio between a power source voltage Vds and a breakdown voltage Vbr of the second transistor is 10 or higher, and the first transistor meeting a formula (4) is selected:

$$C_{ds} < \frac{V_{br}}{V_{ds}} C_{oss} \quad (4)$$

where Coss: output capacitance of the second transistor, Cds: capacitance between a drain and source of the first transistor.

5. A composite semiconductor device comprising a first transistor of normally on type and a second transistor of normally off type that are connected in series with each other, wherein
a source of the first transistor is connected to a drain of the second transistor,
a gate of the first transistor is connected to a source of the second transistor via a resistor, and
the first transistor and the second transistor that meet a formula (5) are selected:

$$V_{br} > V_{m1} + \frac{C_{ds} V_{ds}}{C_{oss} + C_{ds} + C_{gs}} \quad (5)$$

where Coss: output capacitance of the second transistor, Cds: capacitance between a drain and source of the first transistor, Cgs: capacitance between a gate and the source of the first transistor, Vds: power-source voltage, Vm1: drain voltage of the second transistor at a time when the first transistor is turned off after the second transistor is turned off, Vbr: breakdown voltage of the second transistor.

* * * * *